(12) United States Patent
Odelberg et al.

(10) Patent No.: US 12,089,160 B2
(45) Date of Patent: Sep. 10, 2024

(54) NB-IoT WAKE-UP RECEIVER

(71) Applicant: THE REGENTS OF THE UNIVERSITY OF MICHIGAN, Ann Arbor, MI (US)

(72) Inventors: Trevor Odelberg, Ann Arbor, MI (US); David Wentzloff, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 349 days.

(21) Appl. No.: 17/708,017

(22) Filed: Mar. 30, 2022

(65) Prior Publication Data
US 2022/0322235 A1    Oct. 6, 2022

Related U.S. Application Data

(60) Provisional application No. 63/167,698, filed on Mar. 30, 2021.

(51) Int. Cl.
| | |
|---|---|
| H04B 1/04 | (2006.01) |
| G16Y 10/75 | (2020.01) |
| H03F 3/19 | (2006.01) |
| H03L 7/08 | (2006.01) |
| H04W 52/02 | (2009.01) |

(52) U.S. Cl.
CPC ......... *H04W 52/0235* (2013.01); *G16Y 10/75* (2020.01); *H03F 3/19* (2013.01); *H03L 7/08* (2013.01); *H03F 2200/294* (2013.01); *H03F 2200/451* (2013.01)

(58) Field of Classification Search
None
See application file for complete search history.

(56) References Cited

U.S. PATENT DOCUMENTS

2021/0067182 A1\*    3/2021 Ravi ..................... H01Q 3/40

\* cited by examiner

*Primary Examiner* — Gary Lafontant
(74) *Attorney, Agent, or Firm* — Harness, Dickey & Pierce, P.L.C.

(57) ABSTRACT

A low-power standard-compliant NB-IoT wake-up receiver (WRX) is presented. The WRX is designed as a companion radio to a full NB-IoT receiver, only operating during discontinuous RX modes (DRX and eDRX), which allows the full high-power radio to turn off while the wake-up receiver efficiently receives NB-IoTWake-Up Signals (WUS). The fabricated receiver achieves 2.1 mW power at −109 dBm sensitivity with 180 kHz bandwidth over the 750-960 MHz bands. The WRX is fabricated in 28 nm CMOS and consumes 5× less power than the best previously published traditional NB-IoT receivers. This disclosure is the first designed dedicated wake-up receiver for the NB-IoT protocol and demonstrates the benefits of utilizing a WRX to reduce power consumption of NB-IoT radios.

14 Claims, 9 Drawing Sheets

NB-IoT WAKE-UP RECEIVER

CROSS-REFERENCE TO RELATED APPLICATIONS

This application claims the benefit of U.S. Provisional Application No. 63/167,698, filed on Mar. 30, 2021. The entire disclosure of the above application is incorporated herein by reference.

GOVERNMENT CLAUSE

This invention was made with government support under DE-EE0008225 awarded by the Department of Energy. The government has certain rights in the invention.

FIELD

The present disclosure relates to a narrowband wake-up receiver for wireless communication.

BACKGROUND

Narrowband IoT (NB-IoT) is an LTE-based cellular technology standard targeting low data rate, long battery life, and wide coverage applications. Significant interest has been generated around NB-IoT as an enabling technology for massive IoT adoption as a Low-Power Wide Area Network (LPWAN) standard supported by 3GPP, which is easily deployable through software updates in existing cell towers. NB-IoT is therefore expected to fill an important role in the Internet of Things (IoT) ecosystem, bridging the gap between Wireless Local Area Network (WLAN) standards such as Wi-Fi and Bluetooth, and operating over an extremely long range from cell towers as opposed to locally deployed routers like LoRaWAN.

As NB-IoT co-exists within the LTE environment and is designed for forward compatibility with 5G NR, the complexity overhead of NB-IoT is much higher than that of other typical IoT wireless protocols. Most notably, NB-IoT uses 12-subcarrier OFDM with QSPK subcarrier modulation and a bandwidth of 180 kHz for downlink signaling, which puts high demands on the RF hardware. Due to this added complexity, the power consumption of NB-IoT radios have not fallen low enough to be considered viable for many IoT applications.

The typical solution to reduce RX power is to duty-cycle the receiver, allowing only discontinuous communication at predetermined intervals to reduce average power. Aggressive duty cycling is currently needed for NB-IoT radios due to their higher power, rendering the receiver unreachable for the majority of the time. This is unacceptable for many IoT applications where communication is needed infrequently but with short latency, such as safety-critical scenarios.

This section provides background information related to the present disclosure which is not necessarily prior art.

SUMMARY

This section provides a general summary of the disclosure, and is not a comprehensive disclosure of its full scope or all of its features.

A narrowband wake-up receiver is interfaced with a main radio and configured to receive a wireless wake-up signal and subsequently alert the main radio. The wake-up receiver preferably operates in accordance with Narrowband IoT standard.

In one embodiment, the wake-up receiver includes: an antenna configured to receive an RF signal, a low noise amplifier interfaced with the antenna; a local oscillator, and a mixer circuit configured to receive the RF signal from the low noise amplifier as well as a mixing signal from the local oscillator. The mixer circuit downconverts the frequency of the RF signal to an intermediate frequency. The wake-up receiver further includes a fractional n phased-locked loop circuit interfaced with the local oscillator.

In some embodiments, the wake-up receiver further includes a frequency locked loop circuit interfaced with the local oscillator. In response to the wake-up receiver being powered on, the frequency locked loop circuit is enabled and the fractional n phased-locked loop circuit is disabled. After the wake-up received has been powered on for a period of time, the frequency locked loop circuit is disabled and the fractional n phased-locked loop circuit is enabled.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

For many NB-IoT use cases envisioned by 3GPP, communication is infrequent over long periods of time. To facilitate this, the NB-IoT standard includes Discontinuous or Extended Discontinuous Receive (DRX or eDRX) mode while in idle operation. During DRX/eDRX, a limited communication link is still maintained to the network, and the device waits to receive regular paging events to decide when to change configuration. Introduced in Rel. 15 of the standard, these paging events are prepended with a unique correlation-based OFDM Zadoff-Chu sequence, the Narrowband Wake Up Signal (WUS), to allow the device to remain in a lower power state as long as possible, and only wake-up to decode a paging event payload if the WUS is properly identified. For the majority of operation for a sparsely communicating radio, it is primarily receiving only WUS signals and not typical NB-IoT traffic. Typically, the same RF front end is used to receive all incoming messages. This is power inefficient as demodulating the WUS signaling is less demanding than standard NB-IoT signaling, and therefore utilizing the main NB-IoT RX for just WUS messages wastes unnecessary power. A different RF front end can be used when operating in the DRX/eDRX mode, motivating the use of a wake-up receiver. In this way, the wake-up receiver can be optimized for receiving the WUS signal as efficiently as possible. This can significantly reduce the average power of the device without increasing communication latency.

Recently reported NB-IoT radios have not addressed NB-IoT RX power consumption or explored integration of wake-up receivers. In one prior work, an NB-IoT TRX with integrated PA and multi-tone TX support is reported; however, the RF receiver consumes 53 mW of power in lower band operation. In another work, the emphasis was put on GNSS and NB-IoT integration but not low power, with an RF RX power consumption of 50 mW reported. The SAW-less NB-IoT TRX of duty cycles the RX LO to achieve a lower power consumption, but still spends considerable power on the RF front end and reports an RX power of 11.8 mW. The limiting factor for these receivers is the use of high-powered RF front-end components and frequency synthesizers which are needed demodulate OFDM QPSK messages while still meeting high sensitivity.

Figure 1:
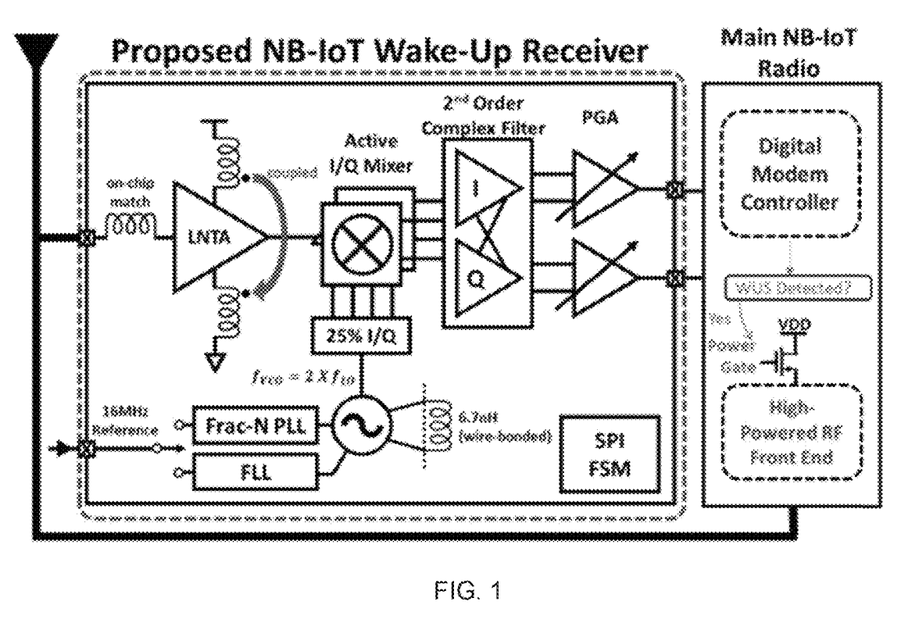
FIG. 1 is a block diagram showing a narrowband wake-up receiver interfaced with the main radio.

FIG. 1 depicts an example embodiment of a narrowband wake-up receiver 10 interfaced with a main radio 2. The wake-up receiver 10 is configured to receive a wireless wake-up signal and subsequently alert the main receiver. The main receiver 2 operates in either a low power state or a high power state, such that the main receiver consumes more power in the high power state than in the low power state. In response to receiving an alert from the wake-up receiver 10, the main receiver 2 transitions form a low power state to a high power state and is thereby enabled to process NB-IoT traffic.

The key innovation is the introduction and design of a stand-alone wake-up receiver 10 for NB-IoT to reduce power. Thus, ease of integration with the NB-IoT standard is important in addition to the power and sensitivity performance of the wake-up receiver 10. The WUS is not modified from that sent from commercial cell towers utilizing Rel. 15 NB-IoT, meaning no logistical cost is associated with this implementation of a wake-up receiver 10. This is a key difference between WRX architectures for other protocols that require firmware changes or non-standard compliant OOK signaling to be transmitted. The wake-up receiver also achieves a similarly low sensitivity as the main receiver as required by the NB-IoT specification for max coupling range, meaning the use of a wake-up receiver 10 will not practically limit deployment range. The wake-up receiver may also share the digital modem 4 of the full NB-IoT receiver 2 for demodulation while keeping the main radio's RF components off. IN the example embodiment, the wake-up receiver 10 operates in the 750-960 MHz bands, common in NB-IoT for improved signal penetration, allowing the full radio and the WRX to share the same antenna through separate matching networks. The WRX also does not require the use of an off-chip SAW filter.

With continued reference to FIG. 1, the wake-up receiver 10 is comprised primarily of: an antenna 11, a low noise amplifier 12, a mixer circuit 13, a local oscillator 16, and a fractional n phased-locked loop circuit 18. In the example embodiment, the wake-up receiver 10 is an LNTA-first receiver followed by an active mixer that generates quadrature signals out. Due to the OFDM modulation of the WUS signal, low-IF is preferred rather than direct conversion to reduce center frequency offset (CFO) effects on subcarriers near DC, as well as reduce 1/f noise. The down-converted quadrature signals are filtered by 2nd order complex polyphase filters 14 that provide bandpass filtering and reject the image frequency. A frequency synthesizer consisting of a fine-step fractional-N PLL 18 and low-power LC-VCO allows for tuning over a wide range of input frequencies. Each of these components is further described below.

Figure 2:
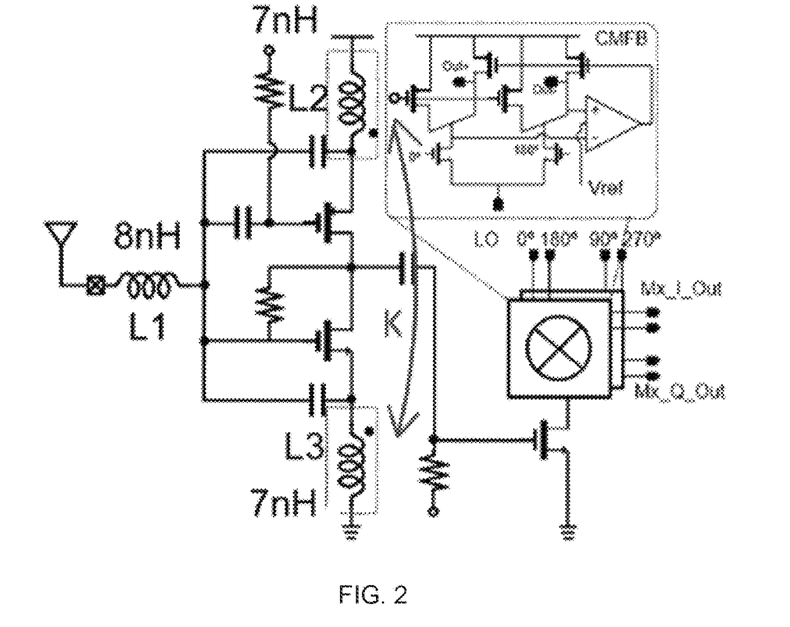
FIG. 2 is a schematic depicting an example embodiment of a current-reuse low-noise transconductance amplifier with inductive degeneration and active mixer.
Figure 3A:
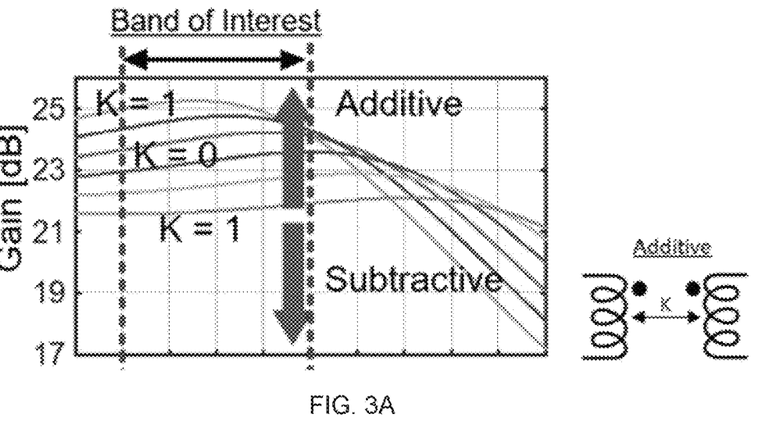
FIGS. 3A and 3B are graphs showing the gain and NF, respectively, of the LNTA swept by inducive coupling coefficient in subtractive and additive winding configurations.
Figure 3B:
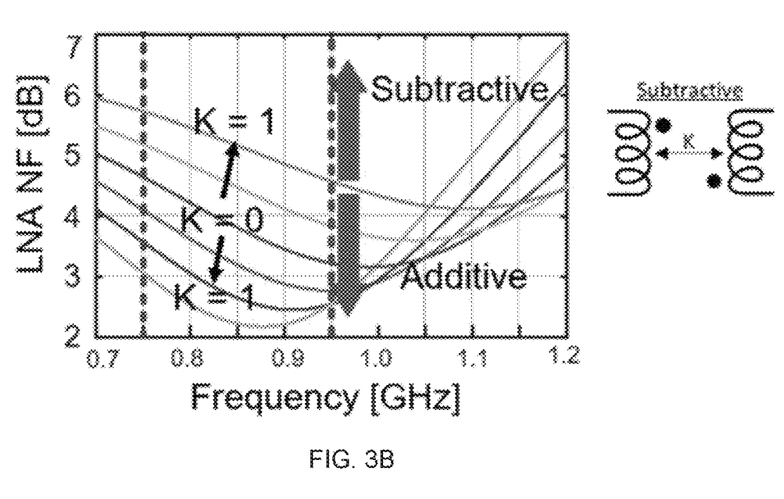

In the example embodiment, the low noise amplifier has a current-reuse circuit arrangement. More specifically, a current-reuse inductively degenerated Low-Noise Transconductance Amplifier (LNTA) is used for its power efficiency as seen in FIG. 2. However, due to the lower frequency for typical NB-IoT bands of 750-960 MHz, the on-chip inductors suffer from large area. Instead, an RF transformer was designed to take the place of the drain and source inductors, reducing the LNTA area by 40%. According to simulation, the mutual coupling of the RF transformer was designed to be additively wound with K=1 to provide the best performance in the lower band, improving NF by 1.5 dB and gain by 2 dB as seen in FIGS. 3A and 3B. Thus, the low noise amplifier preferably includes a transformer with a coupling factor of one. Other types of low noise amplifiers also fall within the broader aspects of this disclosure.

The mixer circuit 13 is configured to receive the amplified RF signal from the low noise amplifier 12 as well as a mixing signal from the local oscillator 15. The mixer circuit 13 in turn converters the amplified RF signal into in phase and quadrature signals at a lower intermediate frequency. The I/Q signals serve as input to the $2^{nd}$ order complex filters 14. The I/Q signals pass through a set of programmable-gain amplifiers 15 before being passed on to the main radio 2 as a wake-up signal.

Figure 4:
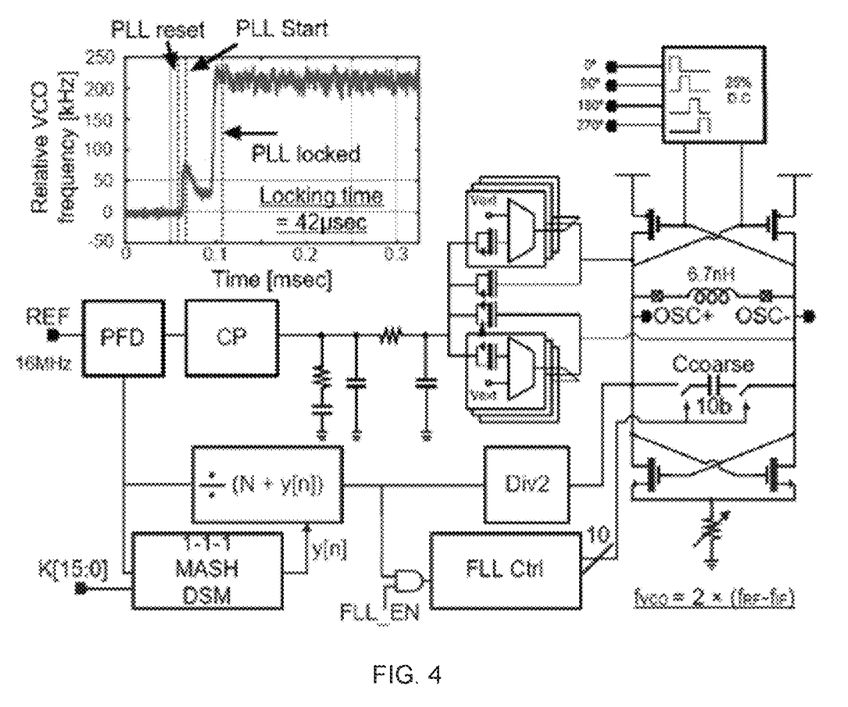
FIG. 4 is a schematic of an example embodiment of a local oscillator with fractional-N PLL and LC-VCO.

FIG. 4 depicts an example of a local oscillator for use in the wake-up-receiver 10. The frequency synthesizer of the wake-up-receiver 10 must have fine-tuning resolution to accurately align to the 180 kHz bandwidth OFDM WUS messages while remaining low power. However, phase noise performance can be relaxed due to the correlation-based WUS detector, which can accept lower SNR. A favorable design tradeoff was found by reducing LO phase noise performance (therefore increasing integral LO noise) to reduce average LO power with minimal impact on receiver sensitivity.

The proposed design includes a frequency locked loop (FLL) circuit 17 and a fractional n phased-locked loop circuit 18; both of which are interfaced with the local oscillator 16. During operation, the wake-up receiver is powered down during period intervals. In response to the wake-up receiver being powered on, the frequency locked loop circuit 17 is enabled and the fractional n phased-locked loop circuit 18 is disabled. After the wake-up receiver has been powered on for a period of time, the frequency locked loop circuit 17 is disabled and the fractional n phased-locked loop circuit 18 is enabled.

More specifically and to achieve a fine frequency step resolution, the LC-VCO goes through a two-step process using both an FLL 17 and fractional-N PLL 18 loop. First, course tuning is achieved by enabling the FLL loop to control 10-bit MOM cap arrays within the VCO core. Next, the FLL is disabled and the fractional-N PLL is turned on to provide fine-frequency tuning. By enabling the FLL first, the locking time of the PLL is reduced. In the example embodiment, the fractional-N PLL uses MASH-1-1-1 modulation and achieves a minimum frequency accuracy of 244 Hz, which allows for fine-tuning to align to NB-IoT WUS resource blocks. Long-term frequency accuracy is maintained by acting on the PLL during infrequent synchronization events as specified by the NB-IoT standard. In this example, the fractional-N PLL and FLL circuitry consume only 357 µW total power with a 16 MHz reference, and achieve a PLL lock time of 42 µs, well beneath the WUS signal length of 785 µs, allowing fast transition from full radio to WRX operation.

To further reduce LC-VCO power, an inductor is electrically coupled to the local oscillator, where local oscillator is on chip while the inductor resides off chip. The off-chip, 0.6×0.3 mm inductor was used to overcome low Q on-chip inductors with minimal system size increase. The inductor is wire bonded in-package to reduce parasitic loading and system size. The addition of the carefully wire-bonded off-chip inductor reduces LC-VCO power consumption by approximately 30% compared to an on-chip inductor. The LC-VCO operates at twice the center frequency and generates 4-phase 25% duty-cycle signals to drive the active mixer.

Figure 5:
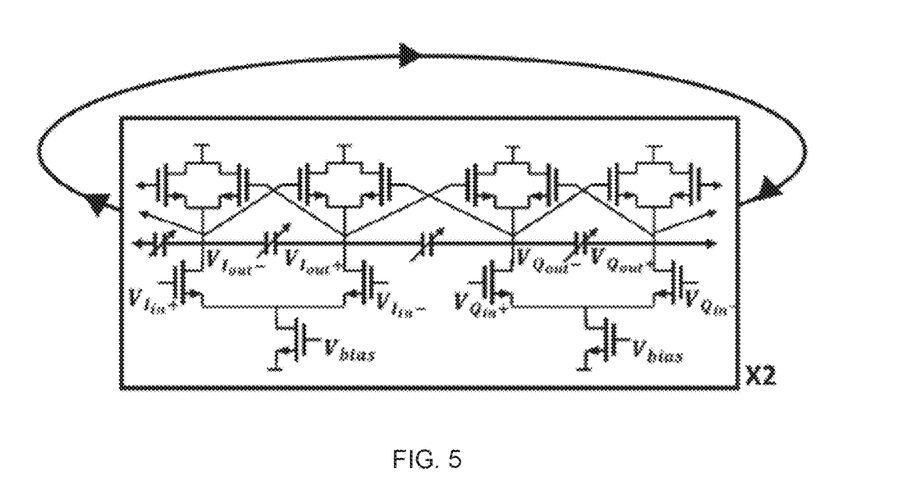
FIG. 5 is a schematic of an example tunable complex band-pass filter.

Due to the use of low-IF down conversion, image rejection in addition to channel selection is needed. In one example, a 2nd order cross-coupled complex poly-phase filter is used to provide image rejection of 25 dB as seen in FIG. 5. The filter uses capacitive DACs which provide tunability of its bandpass response to provide channel selection and I/Q mismatch calibration. Programmable gain amplifiers (PGAs) are used after the complex filter before demodulation off-chip.

Figure 6:
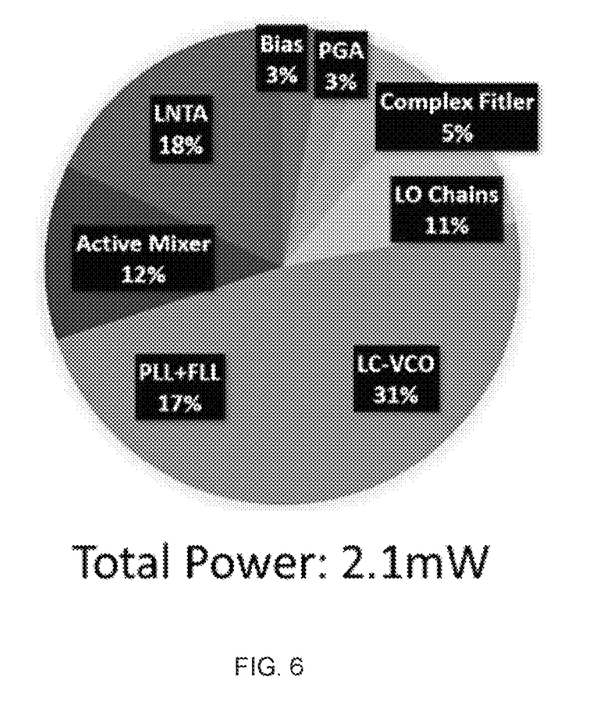
FIG. 6 is a graph showing the power breakdown of the narrowband wake-up receiver.
Figure 7:
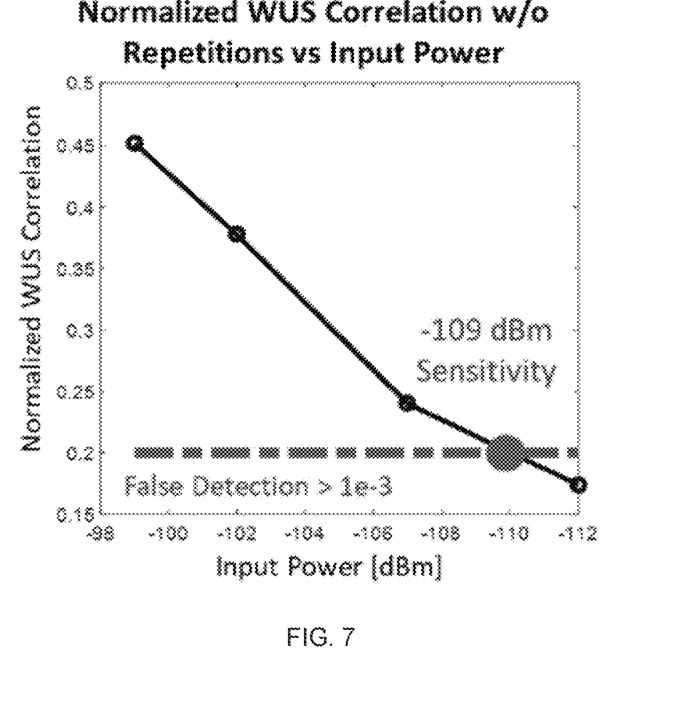
FIG. 7 is a graph showing the sensitivity of the narrowband wake-up receiver.
Figure 8:
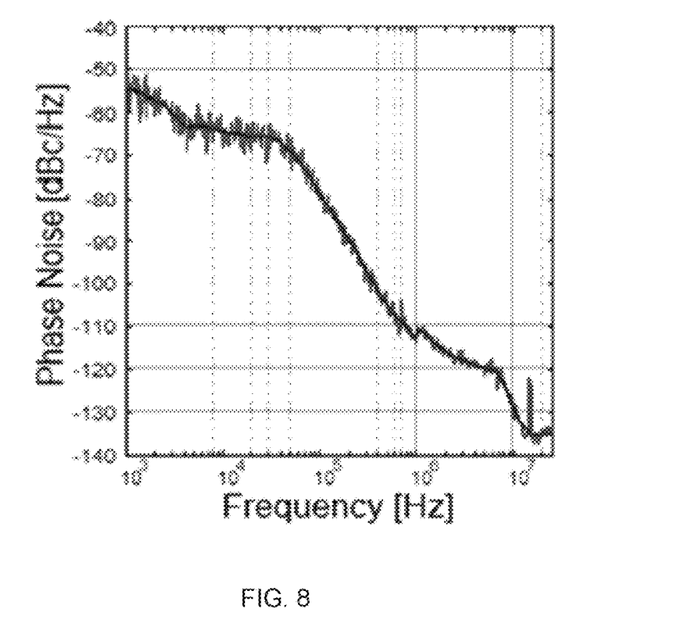
FIG. 8 is a graph showing the phase noise of the PLL.
Figure 9:
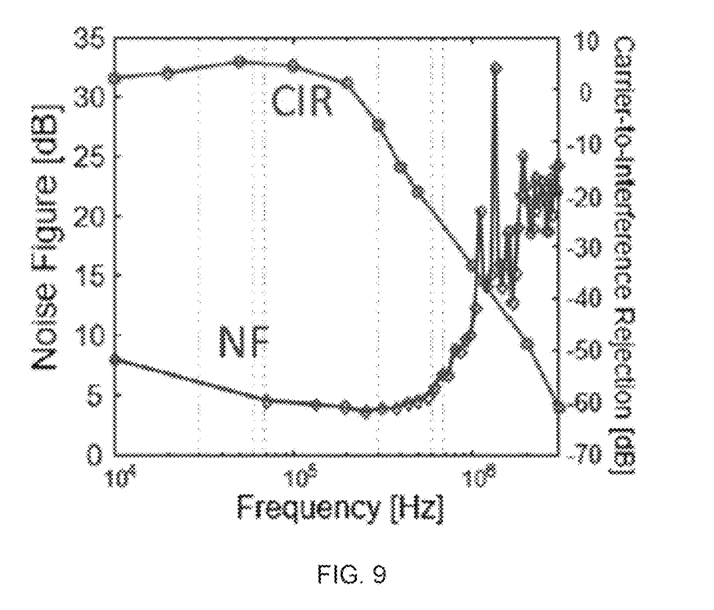
FIG. 9 is a graph showing the noise figure and barrier to interference rejection of the narrowband wake-up receiver.

As proof of concept, the NB-IoT wake-up receiver 10 was fabricated in 28 nm CMOS, operates at 0.9V, and occupies an area of 1.08 mm2. Power breakdown and sensitivity are shown in FIGS. 6A and 6B, respectively. Sensitivity performance was measured by sending the standard-specified Zadoff-Chu OFDM WUS signal to the WRX, then using an FFT and correlating the baseband signal off-chip. Both the correct WUS signal and incorrect WUS signals were swept to find false detection probabilities. A normalized correlation of >0.2 was found to be needed to ensure false detection probability fell below >1 e−3, and sensitivity was taken at this value. FIGS. 7A and 7B shows the measured performance of the PLL with a phase noise of −111 dBc/Hz@1 MHz offset, as well as noise figure and carrier to interference rejection of the WRX. A NF of 4-8 dB is measured in the low-IF bandwidth of 10-190 kHz. This NF variation is due to an underestimation of 1/f noise effects in this process.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A narrowband wake-up receiver, comprising;
an antenna configured to receive an RF signal;
a low noise amplifier interfaced with the antenna;
a local oscillator;
a mixer circuit configured to receive the RF signal from the low noise amplifier and a mixing signal from the local oscillator, where the mixer circuit downconverts frequency of the RF signal to an intermediate frequency; and
a fractional n phased-locked loop circuit interfaced with the local oscillator, wherein the wake-up receiver is powered down during period intervals.

2. The wake-up circuit of claim 1 further includes a frequency locked loop circuit interfaced with the local oscillator, where the frequency locked loop circuit is enabled and the fractional n phased-locked loop circuit is disabled in response to the wake-up receiver being powered on.

3. The wake-up receiver of claim 1 wherein, after the wake-up received has been powered on for a period of time, the frequency locked loop circuit is disabled and the fractional n phased-locked loop circuit is enabled.

4. The wake-up receiver of claim 1 wherein the low noise amplifier has a current-reuse circuit arrangement.

5. The wake-up received of claim 4 wherein the low noise amplifier includes a transformer with a coupling factor of one.

6. The wake-up receiver of claim 1 operates in accordance with Narrowband IoT standard.

7. The wake-up receiver of claim 1 further comprises an inductor electrically coupled to the local oscillator, where the local oscillator resides on a chip and the inductor resides off the chip.

8. A narrowband receiver system, comprising;
a wake-up receiver; and
a main receiver configured to operate in a high power state and a low power state, where the main receiver operates in a high power state in response to a wake-up signal received from the wake-up receiver and the main receiver consumes more power in the high power state than in the low power state, wherein the wake-up receiver includes:
an antenna configured to receive an RF signal;
a low noise transconductance amplifier interfaced with the antenna;
a local oscillator;
a mixer circuit configured to receive the RF signal from the low noise transconductance amplifier and a mixing signal from the local oscillator, where the mixer circuit downconverts frequency of the RF signal to an intermediate frequency;
a frequency locked loop circuit interfaced with the local oscillator; and
a fractional n phased-locked loop circuit interfaced with the local oscillator.

9. The wake-up circuit of claim 8 wherein the frequency locked loop circuit is enabled and the fractional n phased-locked loop circuit is disabled in response to the wake-up receiver being powered on.

10. The wake-up receiver of claim 9 wherein, after the wake-up received has been powered on for a period of time, the frequency locked loop circuit is disabled and the fractional n phased-locked loop circuit is enabled.

11. The wake-up receiver of claim 8 wherein the low noise amplifier has a current-reuse circuit arrangement.

12. The wake-up received of claim 11 wherein the low noise amplifier includes a transformer with a coupling factor of one.

13. The wake-up receiver of claim 8 operates in accordance with Narrowband IoT standard.

14. The wake-up receiver of claim 8 further comprises an inductor electrically coupled to the local oscillator, where the local oscillator resides on a chip and the inductor resides off the chip.

\* \* \* \* \*